(12) United States Patent
Yasuda (10) Patent No.: US 6,934,523 B2
(45) Date of Patent: Aug. 23, 2005

(54) TUNER

(75) Inventor: Masashi Yasuda, Nagoya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 633 days.

(21) Appl. No.: 09/960,989

(22) Filed: Sep. 25, 2001

(65) Prior Publication Data

US 2002/0065059 A1 May 30, 2002

(30) Foreign Application Priority Data

Sep. 29, 2000 (JP) ........................................ 2000-300077

(51) Int. Cl.[7] .............................................. H04B 15/00
(52) U.S. Cl. .................................... 455/313; 455/552.1
(58) Field of Search ............................... 455/3.01–3.02,
455/3.06, 304–305, 310–313, 315–319,
326, 339, 552.1; 331/107 R, 117 R, 108 D;
348/731–733; 725/120; 375/148–152, 303–307

(56) References Cited

U.S. PATENT DOCUMENTS

| | | | | |
|---|---|---|---|---|
| 5,950,112 | A | * | 9/1999 | Hori et al. .................. 725/148 |
| 6,124,766 | A | * | 9/2000 | Matsuura ................ 331/117 R |
| 6,175,746 | B1 | * | 1/2001 | Nakayama et al. ...... 455/552.1 |
| 6,256,511 | B1 | * | 7/2001 | Brown et al. ............. 455/552.1 |

FOREIGN PATENT DOCUMENTS

| | | | |
|---|---|---|---|
| EP | 715403 A1 * | 6/1996 | .......... H03D/07/16 |
| EP | 0 757 483 | 2/1997 | |
| GB | 2 236 225 | 3/1991 | |

* cited by examiner

*Primary Examiner*—George Eng
(74) *Attorney, Agent, or Firm*—Wenderoth, Lind & Ponack, L.L.P.

(57) ABSTRACT

A single circuit-configured tuner is capable of selectively switching between two operating modes. A radio frequency signal, quadrature-modulated by a base-band digital signal, is captured into a single input terminal and then split into two signals. Each signal is fed into a mixer at each branch circuit block. Each mixer receives an oscillating frequency of a local oscillator. At this time, the oscillating frequency determines the operating mode. In the first operating mode, as the oscillating frequency is determined to be equal to the rf signal, the rf signal undergoes quadrature detection, resulting in that the original base-band digital signal is obtained at an output terminal coupled to each mixer, that is, the tuner works as an I/Q detection tuner. On the other hand, in the second operating mode, as the oscillating frequency is determined so that the difference between the oscillating frequency and the frequency of the rf signal is to be equal to an IF, the tuner works as an IF tuner.

16 Claims, 5 Drawing Sheets

TUNER

FIELD OF THE INVENTION

The present invention relates to a dual-mode operative tuner with a single input portion and dual output portions, which processes signals fed to the input portion and outputs them through the output portions corresponding to respective modes.

BACKGROUND OF THE INVENTION

Conventional tuners are commonly categorized as the following two types: (i) a tuner that outputs quadrature detection (hereinafter referred to as I/Q detection) signals, and (ii) a tuner that outputs intermediate frequency (hereinafter referred to as IF) signals. A tuner that belongs to type (i), typified by a digital TV tuner receiving digital signals, demodulates by using an I/Q detection technique, a radio frequency (hereinafter referred to as rf) signal that has been quadrature-modulated by a base-band digital signal (hereinafter this rf signal is referred to as an rf digital signal), and then outputs an I/Q detection signal—hereinafter such a tuner is referred to as an I/Q detection tuner.

On the other hand, a tuner that belongs to type (ii) converts the frequency of the input signal into an IF, without I/Q detection, and then outputs an IF signal—hereinafter such a tuner is referred to as an IF tuner.

The latter tuner may convert not only rf signals conventionally modulated by base-band analog signals, but may also convert rf digital signals into IF signals without detection.

Figure 4:
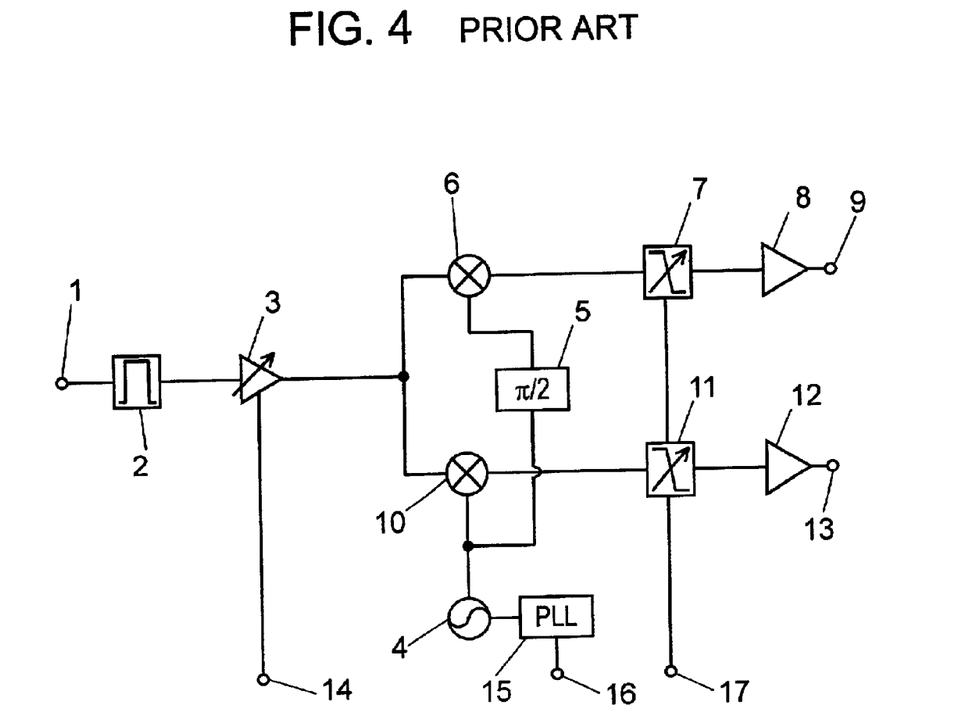
FIG. 4 is a block diagram indicating a first example of the prior-art tuner.

FIG. 4 shows a block diagram of the prior-art I/Q detection tuner. Entering input terminal 1, an rf digital signal is fed into band-pass filter (BPF) 2 and variable gain amplifier 3. After that, the signal is split into two signals to enter each branch circuit block. In one branch circuit, i.e., the upper circuit block in FIG. 4, mixer 6 receives the rf digital signal and an output signal from local oscillator 4. The output signal from oscillator 4 is provided with a 90° phase-shift by phase-shifter 5 before entering mixer 6. Phase-locked loop (PLL) circuit 15 determines the oscillating frequency generated in oscillator 4 so as to synchronize with the carrier frequency of the rf digital signal. Mixer 6 outputs a detection output signal. The detection output signal is carried, via low-pass filter (LPF) 7 and amplifier 8, to output terminal 9 as an I-signal. Similarly, in the other branch circuit—the lower circuit block in FIG. 4, mixer 10 receives the rf digital signal and an output signal from local oscillator 4, but no phase-shift is provided with the output signal. Therefore, mixer 10 outputs a detection output signal different from the output signal from mixer 6 in the upper branch. The detection output signal from mixer 10 is carried, via low-pass filter 11 and amplifier 12, to output terminal 13 as a Q-signal.

Through the process above, the I/Q detection tuner in FIG. 4 processes the two different signal components individually in each branch—one having no phase-shift and the other one having a phase-shift of 90° with respect to the phase of the rf digital signal.

Control terminal 14 works as an external controller of the amplifying level of variable gain amplifier 3. Control terminal 16 controls PLL circuit 15. Control terminal 17 works as an external controller of cut-off frequencies of low-pass filters 7 and 11.

Figure 5:
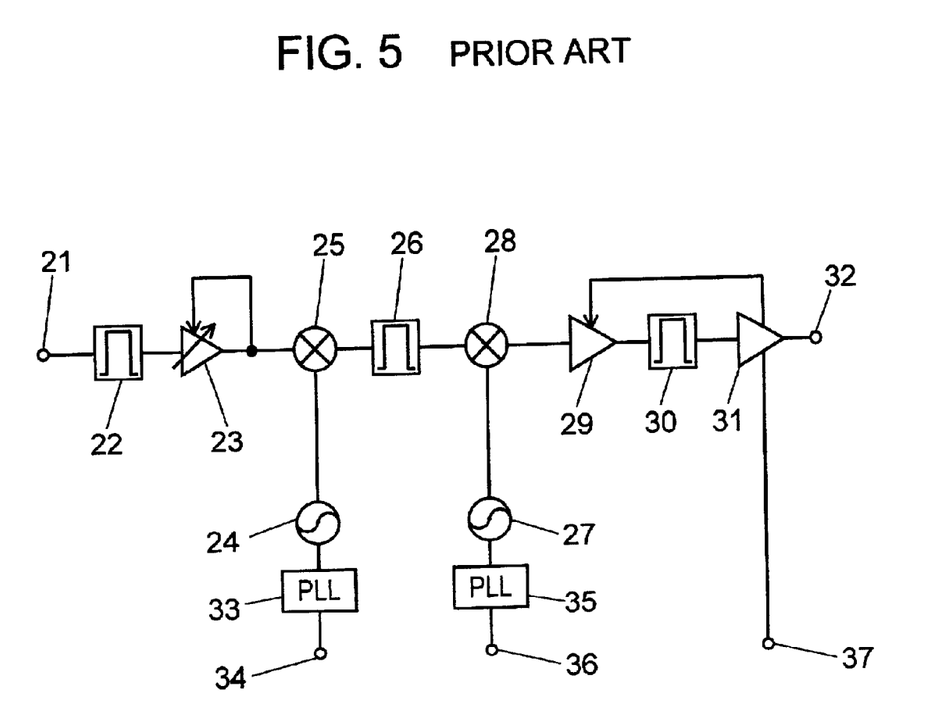
FIG. 5 is a block diagram indicating a second example of the prior-art tuner.

FIG. 5 is a block diagram of the prior-art IF tuner. An rf signal fed from input terminal 21 enters first mixer 25, via BPF 22 and first AGC amplifier 23. The signal is then up-converted into a first IF signal by first mixer 25 and first local oscillator 24 to pass through first IF band-pass filter 26. First PLL circuit 33 determines the oscillating frequency of oscillator 24. The IF signal fed from BPF 26 is now down-converted into a second IF signal by second mixer 28 and second local oscillator 27. Second PLL circuit 35 determines the oscillating frequency of oscillator 27. The second IF signal enters automatic gain control (AGC) amplifying circuit—formed of variable gain amplifier 29, second IF band-pass filter 30, and variable gain amplifier 31—and goes out from output terminal 32 as an IF signal. As described above, the IF tuner shown in FIG. 5 has employed a double super heterodyne-system tuner in which an IF signal is up-converted and then down-converted to minimize image interference.

Terminals 34 and 36 control PLL circuits 33 and 35, respectively. Terminal 37 serves as an external controller of the amplifying level of variable gain amplifies 23, 29, and 31.

There is a need for a tuner receiving a digital signal to be selectively used from the two types of tuners described above as a component of a receiver according to receiver specifications, because such tuners have not been commonly used for various kinds of receivers.

SUMMARY OF THE INVENTION

The present invention addresses the problem above. It is therefore the object of the present invention to provide a tuner serving as an I/Q detection tuner and an IF tuner, allowing the tuner to be commonly used as a same component for various kinds of receivers using it. It is another object of the present invention to provide a low-cost tuner by streamlining manufacturing steps and products control of tuners.

To achieve the aforementioned object, the tuner of the present invention works as follows:

a) An input terminal receives an rf signal that has been quadrature-modulated by a digital signal.

b) A first mixer and a second mixer are placed at each branch so as to receive each signal split into two streams on the way from the input terminal.

c) A local oscillator supplies the mixers with local oscillating signals.

d) A first phase-shifter, which is connected between the local oscillator and the first mixer, provides a local oscillating signal with a phase-shift of 90°.

e) A first filter and a second filter are connected to the output portions of the first and second mixers, respectively.

f) A first output terminal and a second output terminal are connected to the output portions of the first and second filters, respectively.

g) In a first operating mode, the local oscillator is synchronized with the rf signal. The first and the second output terminals output quadrature detection signals.

h) In a second operating mode, the local oscillating frequency is so determined that the difference between the local oscillating frequency and the radio frequency is to be equal to the IF. In addition, the output signal from the first mixer is given a phase-shift of 90° by a second phase-shifter, and added to the output signal from the second mixer. As a result, the second output terminal outputs an IF signal.

i) The first and second operating modes are switch-selectable, that is, selecting the first operating mode by a switch allows the first and second output terminals to output quadrature detection signals, while selecting the second operating mode by the switch allows the second output terminal to an IF signal.

As an aspect of the present invention, the serial circuit formed of the second phase-shifter and the ON/OFF switch is connected between the output portions of the first and the second mixer. Turning the switch ON allows the second terminal to output an IF signal, and the tuner goes into the second operating mode. On the other hand, turning the switch OFF allows the first and second terminals to output an I/Q detection output signals, and the tuner goes into the first operating mode.

As another aspect of the present invention, a first changeover-switch may be placed on the output portion of the second mixer together with the ON/OFF switch. With this structure, the output portion of the second mixer selectively connects with an LPF and a BPF according to the selection of the first changeover-switch. Thus, the second filter serves as an LPF in the first operating mode, and as a BPF in the second operating mode, while the first filter serves as an LPF in the first operating mode.

As still another aspect of the present invention, a second changeover-switch may be placed, instead of the ON/OFF switch, on the output portion of the first mixer. With the structure above, the output portion of the first mixer selectively connects with the first filter, or with the second phase-shifter.

Furthermore, the first and second mixers, the local oscillator, and the switches may be arranged into a balance circuit, all of which may be integrated into a single package, allowing the tuner to be compact and noise-interference resistant.

According to the present invention, as described above, it becomes possible to provide a tuner having double functions as an I/Q detection tuner and an IF tuner, sharing the component with various kinds of receivers using it. This fact realizes streamlined production steps and products-control in large-volume production of tuners.

DESCRIPTION OF THE PREFERRED EMBODIMENTS

Figure 1:
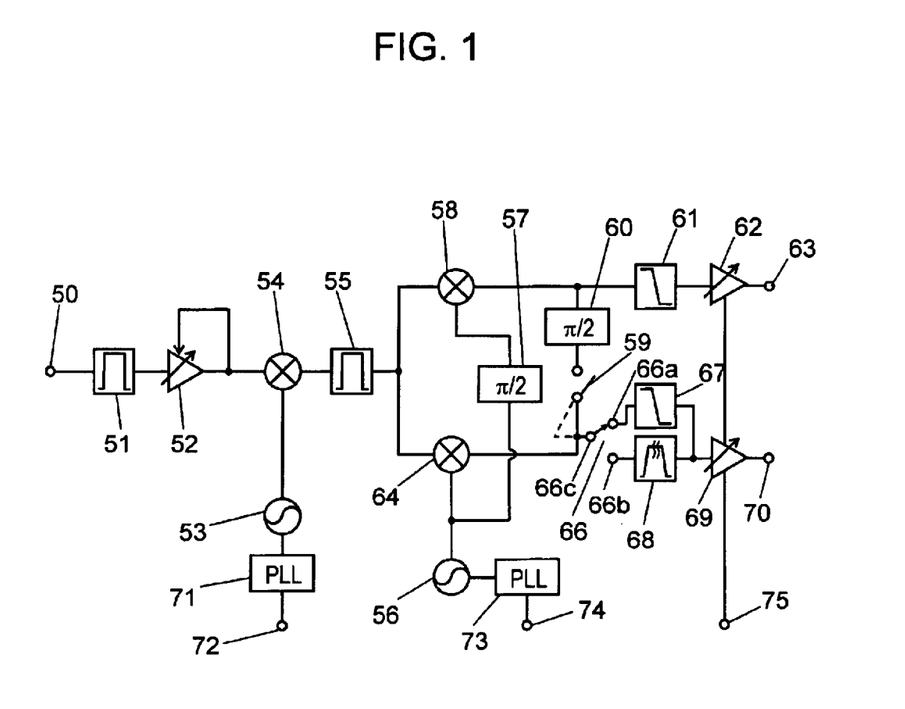
FIG. 1 is a block diagram of a tuner in accordance with a first preferred embodiment of the present invention.

The preferred embodiments of the present invention are described hereinafter with reference to the accompanying drawings.
First preferred embodiment FIG. 1 is a block diagram of a tuner of the first preferred embodiment of the present invention. In FIG. 1, input terminal 50 receives rf signals, such as an rf digital signal generally ranging from 50 through 880 MHz. The received signal is carried to BPF 51 to have out-of-pass band frequencies filtered out, and passed frequencies are fed into variable gain amplifier 52 that performs automatic gain control (AGC). After that, the signal is converted into a desired first IF signal by the tuning circuit formed of mixer 54, local oscillator 53, and PLL circuit 71 determining the oscillating frequency of oscillator 53. The first IF signal enters BPF 55 to filter out undesired out-of-pass-band frequencies. The first IF signal passed through filter 55 is split into two signals, which enter each branch circuit block.

Suppose that an rf digital signal is coming into the upper circuit block shown in FIG. 1. In this case, first mixer 58 receives the first IF signal from BPF 55 together with the output signal from local oscillator 56 with a 90° phase-shift provided by first phase-shifter 57. At this time, the oscillating frequency from local oscillator 56 is synchronized with the first IF by PLL circuit 73. Thus, first mixer 58 outputs an I/Q detection signal. The signal is carried, via first LPF 61 and first variable gain amplifier 62, to first output terminal 63 to output as an I-signal.

In the other circuit block—the lower circuit block in FIG. 1, second mixer 64 receives the first IF signal from BPF 55 together with the output signal from local oscillator 56 (with no phase-shift given, in this case). Therefore, second mixer 64 outputs the detection output signal different from the output signal obtained from first mixer 58. The detection output signal from mixer 64 is carried, through LPF 67 connected with changeover terminal 66a of first changeover-switch 66 and second variable gain amplifier 69, to second output terminal 70 to output as a Q-signal. Through the process above, the tuner of the embodiment performs the first operating mode, serving as an I/Q detection tuner.

Now will be described the other mode, i.e., the second operating mode.

Figure 2:
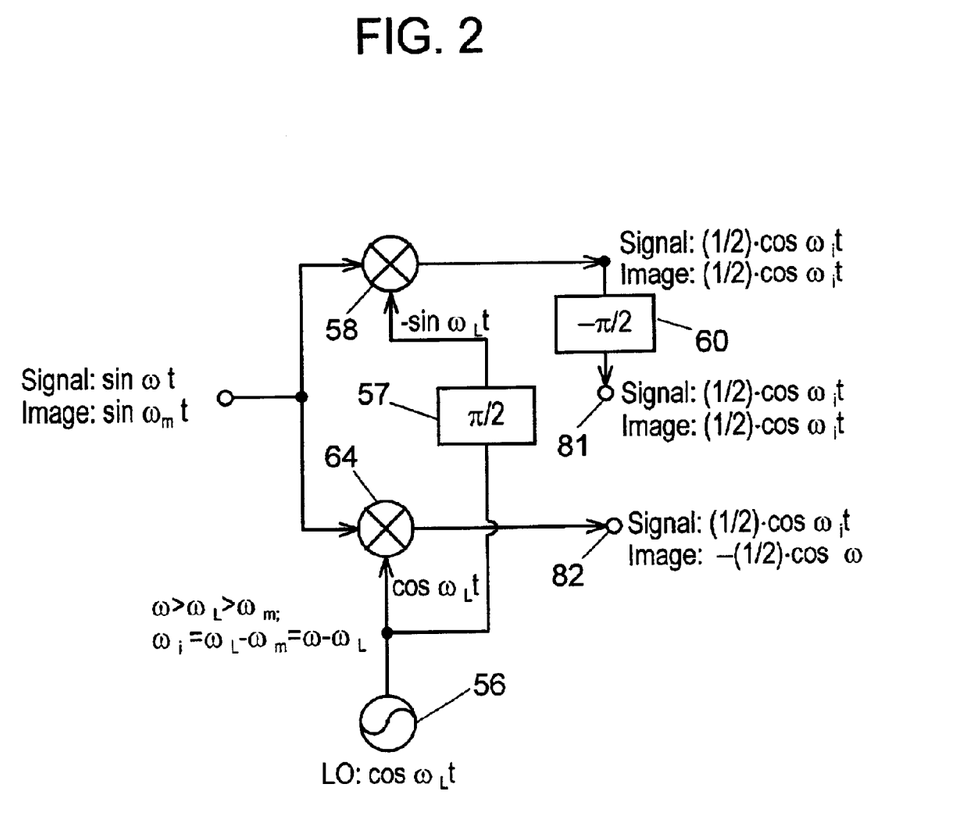
FIG. 2 illustrates the second operating mode of the tuner of the first preferred embodiment.

PLL circuit 73 determines the oscillating frequency of local oscillator 56 so that the difference between the first IF and the oscillating frequency is to be equal to a second IF of about 400 MHz. In this way, first and second mixers 58 and 64 perform the frequency conversion. The second IF signal produced by first mixer 58 is blocked by first LPF 61 and carried to second phase-shifter 60. As illustrated in FIG. 2, the signal frequency component fed from second phase-shifter 60 is in-phase with that fed from second mixer 64. When the ON/OFF switch is set to the ON state, the in-phase components are added to each other. At the same time, first changeover-switch 66 changes the path by contacting with changeover terminal 66b. In this way, the added signal is brought, via second IF band-pass filter 68 and second variable gain amplifier 69, to second output terminal 70 to output as an IF signal.

On the other hand, as shown in FIG. 2, image frequency components, which enter first and second mixers 58 and 64, are 180° out of phase and canceled out at output terminals 81 and 82, so that they are not fed out from second output terminal 70 in FIG. 1.

Through the process above, the tuner of the embodiment also serves as an IF tuner, performing the second operating mode.

ON/OFF switch 59 and first changeover-switch 66 are electronic gang switches formed of PIN diodes.

In the first operating mode, switch 59 is in the OFF state, while in switch 66, common terminal 66c to changeover terminal 66a is in the ON state.

In the second operating mode, switch 59 is ON, and common terminal 66c to changeover terminal 66b is ON.

Therefore, in the first operating mode—the tuner serves as an I/Q detection tuner, and output terminals 63 and 70 output base-band signals, i.e., I- and Q- signals. On the other hand, in the second operating mode—the tuner serves as an IF tuner, and output terminal 70 outputs an IF signal of about 400 MHz.

Although the embodiment describes the signal fed into input terminal 50 as terrestrial broadcasting signals generally ranging from 50 through 860 MHz, digital satellite broadcasting signals generally ranging from 950 MHz through 2.2 GHz may be acceptable. BPF 51 passes through a desired wave, blocking out an undesired one. PLL circuit 71 is so controlled that mixer 54 can obtain the first IF of 1.4 GHz or 1.2 GHz. BPF 55 is made to fit to the first IF. LPFs 61 and 67 have a cut-off frequency of about 50 MHz. BPF 68 has a center frequency of about 400 MHz, and a bandwidth of about 30 MHz.

According to the embodiment, the tuner is formed of a balanced circuit. This structure allows the tuner not only to be noise interference-resistant, but also to be compact due to circuit integration. Furthermore, the structure realizes a low-cost tuner in large-volume production.

Second Preferred Embodiment

Figure 3:
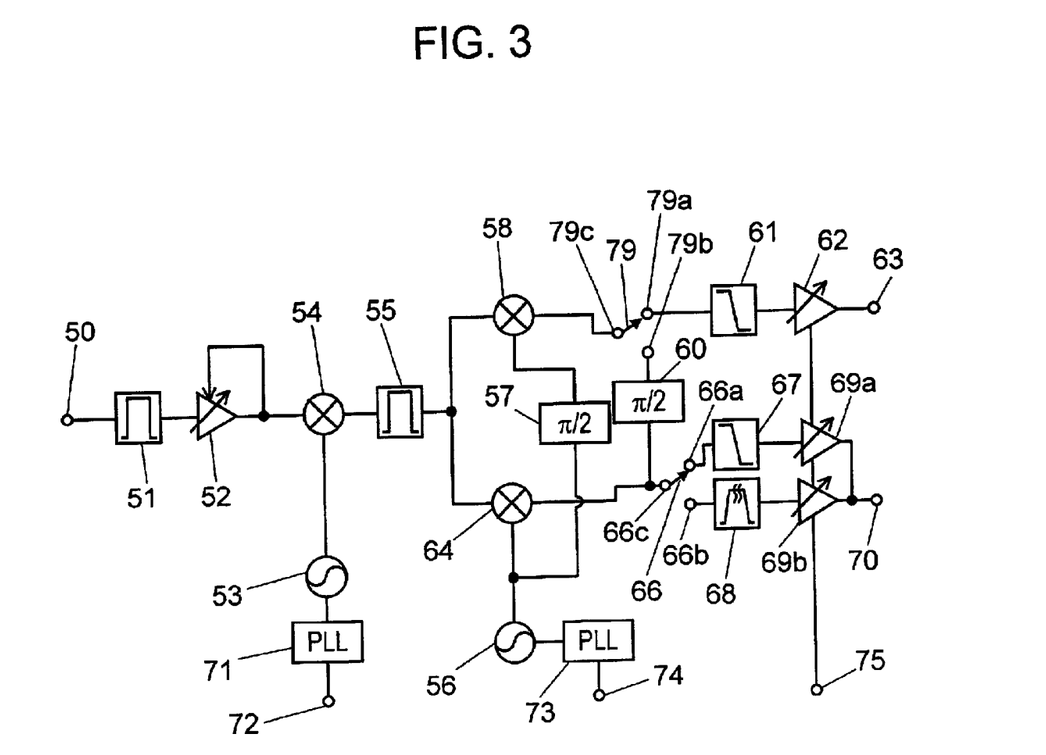
FIG. 3 is a block diagram of a tuner in accordance with a second preferred embodiment of the present invention.

FIG. 3 is a block diagram of a tuner of the second preferred embodiment of the present invention. Here will be described a point of difference from the first preferred embodiment with reference to FIG. 3.

Instead of ON/OFF switch 59 employed in the first preferred embodiment, second changeover-switch 79 is arranged on the output portion of first mixer 58, interlocking with first changeover-switch 66. Changeover terminals 79a and 79b of switch 79 are connected with first LPF 61 and second phase-shifter 60, respectively. More specifically, in the first operating mode: the function as an I/Q detection tuner, (i) common terminal 66c to changeover terminal 66a (of first changeover-switch 66), and (ii) common terminal 79c to changeover terminal 79a (of second changeover-switch 79) are in the ON state.

In the second operating mode: the function as an IF tuner, (i) common terminal 66c to chanaeover terminal 66b, and (ii) common terminal 79c to changeover terminal 79b are in the ON state.

Another point of difference from the first preferred embodiment will be described below.

Changeover terminal 66a of the first changeover-switch is connected through LPF 67 to variable gain amplifier 69a handling base-band frequency, while changeover terminal 66b is connected through BPF 68 to variable gain amplifier 69b handling the second IF.

With the structure above, in the second operating mode (i.e., IF-tuner mode), the output signal from the first mixer is added to the output signal of the second mixers, without depending on the reflection characteristics at the cut-off frequency range of first LPF 61. This protects the quality of the IF signal from degradation. In the structure, the variable gain amplifier is prepared separately for the base-band frequency and for the second IF. This is another plus in making the design of the amplifier simple.

According to the present invention, as described above, it is possible to provide a tuner having two different functions. This fact realizes streamlined production steps and products-control, as well as providing a low-cost, compact and powerful tuner.

What is claimed is:

1. A tuner handling a radio frequency signal, the tuner comprising:

(a) a first mixer operable to receive a first radio frequency signal split from the radio frequency signal;

(b) a second mixer operable to receive a second radio frequency signal split from the radio frequency signal;

(c) a local oscillator operable to provide the first and the second mixers with a local oscillating signal;

(d) a first phase-shifter operable to provide the oscillating signal with a 90° phase-shift, the first phase-shifter being coupled between the local oscillator and the first mixer;

(e) a first filter coupled to an output portion of the first mixer; and (f) a second filter coupled to an output portion of the second mixer, wherein a first operating mode comprises outputting a quadrature detection signal from the first and the second filters, wherein a second operating mode comprises adding an output signal from the second mixer to an output signal from the first mixer that undergoes a 90° phase-shift by a second phase-shifter, and outputting an intermediate frequency signal from the second filter, wherein the first operating mode and the second operating mode are switch-selectable, and wherein the first filter is a first low-pass filter, and a first changeover-switch is coupled with the output portion of the second mixer, by which the second filter can be switched between a second low-pass filter and a band-pass filter.

2. The tuner of claim 1, wherein an oscillating frequency of the local oscillator is set to be equal to a frequency of the radio frequency signal in the first operating mode, while in the second operating mode, an oscillating frequency of the local oscillator is determined so that a difference between a frequency of the radio frequency signal and the oscillating frequency is equal to an intermediate frequency.

3. The tuner of claim 1, wherein a first variable gain amplifier is coupled to an output portion of the first filter, and a second variable gain amplifier is coupled to an output portion of the second filter.

4. The tuner of claim 3, wherein operating frequency bands of the first and second variable gain amplifiers cover pass-band frequencies of the first and the second filters.

5. The tuner of claim 1, wherein the second phase-shifter and an ON/OFF switch are coupled between the output portions of the first and the second mixers.

6. The tuner of claim 1, wherein a first variable gain amplifier handling base-band frequencies is coupled with an the output portion of the second low-pass filter, and a second variable gain amplifier handling intermediate frequencies is coupled with an output portion of the band-pass filter.

7. The tuner of claim 1, wherein the first changeover-switch is couple with the output portion of the second mixer and an output portion of the second phase-shifter, and a second changeover-switch is coupled with the output portion of the first mixer so as to switch the output portion of the first mixer to couple with one of the first filter and an input portion of the second phase-shifter.

8. The tuner of claim 7, wherein the first changeover-switch interlocks with the second changeover-switch.

9. The tuner of claim 7, wherein a first variable gain amplifier handling base-band frequencies is coupled with an output portion of the first low-pass filter, wherein a second variable gain amplifier handling base-band frequencies is coupled with an output portion of the second low-pass filter, and wherein a third variable gain amplifier handling intermediate frequencies is coupled with an output portion of the band-pass filter.

10. The tuner of claim 8, wherein a first variable gain amplifier handling base-band frequencies is coupled with an output portion of the first low-pass filter, wherein a second variable gain amplifier handling base-band frequencies is coupled with an output portion of the second low-pass filter, and wherein a third variable gain amplifier handling intermediate frequencies is coupled with an output portion of the band-pass filter.

11. The tuner of claim 7, wherein the first and the second mixers, the local oscillator, and the first and second changeover-switches are formed of a balanced circuit and integrated into a single package.

12. The tuner of the claim 1, wherein the first and the second mixers, the local oscillator, and the first changeover-switch are formed of a balanced circuit and integrated into a single package.

13. A tuner handling a radio frequency signal, the tuner comprising:
 (a) a first mixer operable to receive a first radio frequency signal split from the radio frequency signal;
 (b) a second mixer operable to receive a second radio frequency signal split from the radio frequency signal;
 (c) a local oscillator operable to provide the first and the second mixers with a local oscillating signal;
 (d) a first phase-shifter operable to provide the oscillating signal with a 90° phase-shift, the first phase-shifter being coupled between the local oscillator and the first mixer;
 (e) a first filter coupled to an output portion of the first mixer; and
 (f) a second filter coupled to an output portion of the second mixer,
 wherein a first operating mode comprises outputting a quadrature detection signal from the first and the second filters,
 wherein a second operating mode comprises adding an output signal from the second mixer to an output signal from the first mixer that undergoes a 90° phase-shift by a second phase-shifter, and outputting an intermediate frequency signal from the second filter,
 wherein the first operating mode and the second operating mode are switch-selectable,
 wherein a serial circuit including the second phase-shifter and an ON/OFF switch is coupled between the output portions of the first and the second mixers,
 wherein the first filter is a first low-pass filter, and
 wherein a first changeover-switch is coupled with the output portion of the second mixer, by which the second filter can be switched between a second low-pass filter and a band-pass filter.

14. The tuner of claim 13, wherein the ON/OFF switch interlocks with the first changeover-switch.

15. The tuner of claim 14, wherein a first variable gain amplifier handling base-band frequencies is coupled with an output portion of the first low-pass filter, wherein a second variable gain amplifier handling base-band frequencies is coupled with an output portion of the second low-pass filter, and wherein a third variable gain amplifier handling intermediate frequencies is coupled with an output portion of the band-pass filter.

16. The tuner of claim 13, wherein a first variable gain amplifier handling base-band frequencies is coupled with an output portion of the first low-pass filter, wherein a second variable gain amplifier handling base-band frequencies is coupled with an output portion of the second low-pass filter, and wherein a third variable gain amplifier handling intermediate frequencies is coupled with an output portion of the band-pass filter.

* * * * *

UNITED STATES PATENT AND TRADEMARK OFFICE
CERTIFICATE OF CORRECTION

PATENT NO. : 6,934,523 B2  Page 1 of 1
APPLICATION NO. : 09/960989
DATED : August 23, 2005
INVENTOR(S) : Masashi Yasuda It is certified that error appears in the above-identified patent and that said Letters Patent is hereby corrected as shown below:

IN THE CLAIMS

In column 6, line 47, "couple" should read --coupled--.

Signed and Sealed this

Second Day of January, 2007

JON W. DUDAS
*Director of the United States Patent and Trademark Office*